(12) United States Patent
Ando et al.

(10) Patent No.: US 10,573,723 B1
(45) Date of Patent: Feb. 25, 2020

(54) VERTICAL TRANSPORT FETS WITH ASYMMETRIC CHANNEL PROFILES USING DIPOLE LAYERS

(71) Applicant: International Business Machines Corporation, Armonk, NY (US)

(72) Inventors: Takashi Ando, Tuckahoe, NY (US); Choonghyun Lee, Rensselaer, NY (US); SangHoon Shin, Yorktown Heights, NY (US); Jingyun Zhang, Albany, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/110,785

(22) Filed: Aug. 23, 2018

(51) Int. Cl.
| | |
|---|---|
| *H01L 29/51* | (2006.01) |
| *H01L 27/092* | (2006.01) |
| *H01L 29/786* | (2006.01) |
| *H01L 21/8238* | (2006.01) |

(52) U.S. Cl.
CPC .... *H01L 29/513* (2013.01); *H01L 21/823857* (2013.01); *H01L 21/823885* (2013.01); *H01L 27/092* (2013.01); *H01L 29/78642* (2013.01)

(58) Field of Classification Search
CPC ..... H01L 29/78642; H01L 29/511–513; H01L 29/7827; H01L 29/66666; H01L 29/42392; H01L 29/0676; H01L 29/66795; H01L 29/785; H01L 27/092; H01L 21/823821; H01L 21/823885; H01L 21/823857
See application file for complete search history.

(56) References Cited

U.S. PATENT DOCUMENTS

| | | | | |
|---|---|---|---|---|
| 8,802,522 B2* | 8/2014 | Ward | ............... | H01J 37/32412 438/199 |
| 9,012,319 B1* | 4/2015 | Choi | ............... | H01L 21/28158 438/591 |
| 9,502,265 B1* | 11/2016 | Jiang | ............... | H01L 21/31155 |
| 9,514,994 B2* | 12/2016 | Ju | ............... | H01L 21/823821 |

(Continued)

OTHER PUBLICATIONS

Jagannathan, H., et al., "Engineering High Dielectric Constant Materials for Band-Edge CMOS Applications", ECS Trans., Oct. 12-Oct. 17, 2008, pp. 19-26, vol. 16, Issue 5.

(Continued)

*Primary Examiner* — Zandra V Smith
*Assistant Examiner* — Jeremy J Joy
(74) *Attorney, Agent, or Firm* — Scully, Scott, Murphy & Presser, P.C.; L. Jeffrey Kelly, Esq.

(57) ABSTRACT

Vertical transport field effect transistors (FETs) having improved device performance are provided. Notably, vertical transport FETs having a gradient threshold voltage are provided. The gradient threshold voltage is provided by forming a gradient threshold voltage adjusting gate dielectric structure between the bottom drain region of the FET and the top source region of the FET. The gradient threshold voltage adjusting gate dielectric structure includes a doped interface high-k gate dielectric material that is located in proximity to the bottom drain region and a non-doped high-k dielectric material that is located in proximity to the top source region. The non-doped high-k dielectric material has a higher threshold voltage than the doped interface high-k gate dielectric.

11 Claims, 13 Drawing Sheets

(56) References Cited

U.S. PATENT DOCUMENTS

| | | | |
|---|---|---|---|
| 9,530,700 B1* | 12/2016 | Mallela | H01L 27/0924 |
| 9,620,612 B2* | 4/2017 | Xu | H01L 27/088 |
| 9,627,511 B1* | 4/2017 | Cheng | H01L 29/66553 |
| 9,773,708 B1* | 9/2017 | Zhang | H01L 21/823828 |
| 9,865,589 B1 | 1/2018 | Lee et al. | |
| 9,870,952 B1* | 1/2018 | Cheng | H01L 21/823487 |
| 9,917,167 B2* | 3/2018 | Jang | H01L 29/4236 |
| 2007/0158702 A1* | 7/2007 | Doczy | H01L 29/4908 257/288 |
| 2013/0299922 A1* | 11/2013 | Choi | H01L 21/82345 257/412 |
| 2016/0225868 A1* | 8/2016 | Kim | H01L 29/4966 |
| 2017/0005003 A1* | 1/2017 | Ando | H01L 21/2636 |
| 2017/0179252 A1* | 6/2017 | Tang | H01L 29/66446 |
| 2017/0256615 A1* | 9/2017 | Chen | H01L 29/1054 |
| 2018/0068901 A1* | 3/2018 | Cheng | H01L 21/823487 |
| 2018/0277448 A1* | 9/2018 | Chen | H01L 21/823857 |
| 2019/0139759 A1* | 5/2019 | Cheng | H01L 21/02362 |

OTHER PUBLICATIONS

Baek, K.-J., et al., "Device Optimization of N-Channel MOSFETs with Lateral Asymmetric Channel Doping Profiles", Transactions on Electrical and Electronic Materials, Feb. 25, 2010, pp. 15-19, vol. 11, No. 1.

Narasimhulu, K., et al., "Impact of lateral asymmetric channel doping on deep submicrometer mixedsignal device and circuit performance", IEEE Transactions on Electron Devices, Dec. 2003, pp. 2481-2489, vol. 50, No. 12.

Panciera, F. et al., "Three-dimensional distribution of Al in high-k metal gate: Impact on transistor voltage threshold", Applied Physics Letters, published online May 18, 2012, p. 201909-1 to 201909-4, 100(20).

Salinas, M., et al., "The relationship between threshold voltage and dipolar character of self-assembled monolayers in organic thin-film transistors", Journal of the American Chemical Society, published Jun. 26, 2012, pp. 12648-12652, 134(30).

\* cited by examiner

VERTICAL TRANSPORT FETS WITH ASYMMETRIC CHANNEL PROFILES USING DIPOLE LAYERS

BACKGROUND

The present application relates to a semiconductor structure and a method of forming the same. More particularly, the present application relates to a semiconductor structure including at least one vertical transport field effect transistor (FET) having a gradient threshold voltage, and a method of forming such a structure.

Conventional vertical transistors are devices where the source-drain current flows in a direction normal to the substrate surface. In such devices, a vertical semiconductor fin (or pillar) defines the channel with the source and drain located at opposing ends of the semiconductor fin. Vertical transistors are an attractive option for technology scaling for 5 nm and beyond.

The lateral asymmetric channel (LAC) doping profile approach provides one of the most effective ways to improve the electrical characteristics of transistor devices. For LAC devices, the doping concentration of the source side is higher than that of the drain side in the channel. The channel potential transition at the source side channel region is much stepper than that of the other channel regions, while the device is operating due to non-uniform channel doping. Such a steep potential distribution near the source side enhances the lateral channel electric field and this increases the carrier mobility. This approach, however, suffers from channel dopant diffusion and dopant variation. Also, it is difficult to design short channel devices using the LAC approach. There is thus a need for providing a vertical transport field effect transistor (FET) having improved electrical characteristics and device performance.

SUMMARY

Vertical transport field effect transistors (FETs) having improved device performance are provided. Notably, vertical transport FETs having a gradient threshold voltage are provided. The gradient threshold voltage is provided by forming a gradient threshold voltage adjusting gate dielectric structure between the bottom drain region of the FET and the top source region of the FET. In the present application, the gradient threshold voltage adjusting gate dielectric structure includes a doped interface high-k gate dielectric material that is located in proximity to the bottom drain region and a non-doped high-k dielectric material that is located in proximity to the top source region. The non-doped high-k dielectric material has a higher threshold voltage than the doped interface high-k gate dielectric material.

One aspect of the present application relates to a semiconductor structure. In one embodiment, the semiconductor structure includes at least one semiconductor fin present in a device region and extending upwards from a semiconductor substrate, wherein an interfacial dielectric material is located on a sidewall surface of a middle portion of the at least one semiconductor fin. A bottom drain region is located above the semiconductor substrate and contacting a sidewall surface of a bottom portion of the at least one semiconductor fin. A gradient threshold voltage adjusting gate dielectric structure is located above the bottom drain region and contacting the interfacial dielectric material, wherein the gradient threshold voltage adjusting gate dielectric structure comprises a doped interface high-k gate dielectric material and a non-doped high-k dielectric material. A workfunction gate electrode is located adjacent a sidewall of the gradient threshold voltage adjusting gate dielectric structure, and a top source region is located on an upper portion of the at least one semiconductor fin.

In another embodiment, the structure includes a vertical transport nFET and a laterally adjacent vertical transport pFET. The vertical transport nFET includes at least one semiconductor fin present in an nFET device region and extending upwards from a semiconductor substrate, wherein an interfacial dielectric material is located on a sidewall surface of a middle portion of the at least one semiconductor fin. A bottom nFET drain region is located above the semiconductor substrate and a contacts sidewall surface of a bottom portion of the at least one semiconductor fin. An nFET gradient threshold voltage adjusting gate dielectric structure is located above the bottom nFET drain region and contacts the interfacial dielectric material, wherein the nFET gradient threshold voltage adjusting gate dielectric structure comprises an nFET doped interface high-k gate dielectric material and a non-doped high-k dielectric material. A first workfunction gate electrode is located adjacent a sidewall of the nFET gradient threshold voltage adjusting gate dielectric structure, and a top nFET source region is located on an upper portion of the at least one semiconductor fin.

The vertical transport pFET includes at least one semiconductor fin present in a pFET device region and extending upwards from the semiconductor substrate, wherein an interfacial dielectric material is located on a sidewall surface of a middle portion of the at least one semiconductor fin. A bottom pFET drain region is located above the semiconductor substrate and contacts a sidewall surface of a bottom portion of the at least one semiconductor fin present in the pFET device region. A pFET gradient threshold voltage adjusting gate dielectric structure is located above the bottom drain region and contacts the interfacial dielectric material, wherein the pFET gradient threshold voltage adjusting gate dielectric structure comprises a pFET doped interface high-k gate dielectric material and a non-doped high-k dielectric material. A second workfunction gate electrode is located adjacent a sidewall of the pFET gradient threshold voltage adjusting gate dielectric structure, and a top pFET source region is located on an upper portion of the at least one semiconductor fin.

Another aspect of the present application relates to a method of forming a semiconductor structure. In one embodiment, the method includes forming at least one semiconductor fin extending upwards from a semiconductor substrate and located in a device region, wherein the at least one semiconductor fin contains a hard mask cap thereon. A bottom drain region is then formed above the semiconductor substrate and contacting a sidewall surface of a bottom portion of the at least one semiconductor fin. An interfacial dielectric material layer is formed on a sidewall surface of a middle portion of the at least one semiconductor fin, and thereafter a high-k gate dielectric material layer is formed laterally adjacent that at least one semiconductor fin. A material stack portion containing an nFET or pFET dipole element containing layer is then formed on a portion of the high-k gate dielectric material layer. An anneal is performed to drive-in the nFET or pFET dipole element into the portion of the high-k gate dielectric material layer that is adjacent the material stack portion to provide a doped interface high-k gate dielectric material, wherein an upper portion of the high-k dielectric material layer remains non-doped. After the anneal, a workfunction metal layer is formed on the physically exposed surface of the doped interface high-k gate dielectric material, and the non-doped portion of the high-k gate dielectric material layer, and thereafter the workfunction metal layer, the non-doped high-k gate dielectric material, and the interfacial dielectric material and the hard mask cap are removed from an upper portion of the at least one semiconductor fin. A top source region is then formed from physically exposed surfaces of the at least one semiconductor fin.

DETAILED DESCRIPTION

Figure 1:
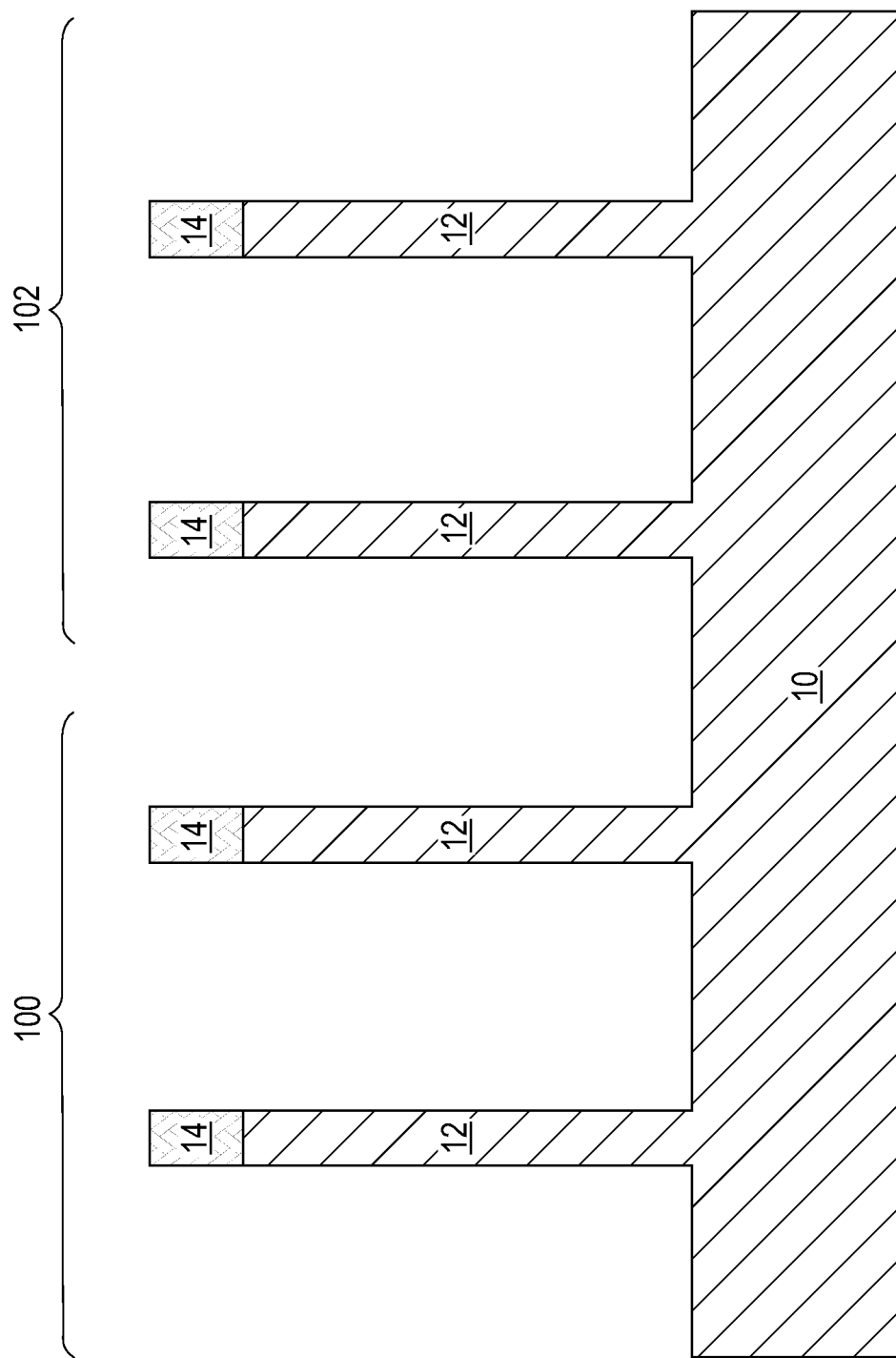
FIG. 1 is a cross sectional view of an exemplary semiconductor structure of the present application during an early stage of fabrication, and including a plurality of semiconductor fins extending upwards from a semiconductor substrate, wherein a first set of the plurality of semiconductor fins is located in an nFET device region, and a second set of the plurality of semiconductor fins is present in a pFET device region, and wherein each semiconductor fin has a hard mask cap present thereon.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the present application during an early stage of fabrication, and including a plurality of semiconductor fins 12 extending upwards from a semiconductor substrate 10, wherein a first set of the plurality of semiconductor fins 12 is located in an nFET device region 100, and a second set of the plurality of semiconductor fins 12 is present in a pFET device region 102, and wherein each semiconductor fin 12 has a hard mask cap 14 present thereon.

Although the present application illustrates the formation of two semiconductor fins 12 in each of the respective device regions (100, 102), the present application is not limited to forming that number of semiconductor fins 12 into the respective device regions (100, 102). Instead, the present application can be employed when one or more semiconductor fins 12 are formed into a respective device region (100, 102). Also, and although the present application describes and illustrates the presence of an nFET device region 100 and a pFET device region 102, the present application works equally well when one of the device regions is excluded.

As used herein, a "semiconductor fin" refers to a semiconductor material portion that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 12 has a height from 20 nm to 200 nm, and a width from 5 nm to 30 nm. Other heights and/or widths that are lesser than, or greater than, the ranges mentioned herein can also be used in the present application. Each semiconductor fin 12 is spaced apart from its nearest neighboring semiconductor fin 12 by a pitch of from 20 nm to 100 nm; the pitch is measured from one point of one semiconductor fin to the exact point on a neighboring semiconductor fin. Also, each semiconductor fin 12 is oriented parallel to each other. An opening or gap is present between each neighboring pair of semiconductor fins 12.

The semiconductor substrate 10 may be composed of a remaining portion of a base semiconductor substrate (not shown). The semiconductor substrate 10 may be composed of one or more semiconductor material having semiconductor properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor fins 12 may be composed of one of the semiconductor material mentioned above for the semiconductor substrate 10. In one embodiment, the semiconductor fins 12 and the semiconductor substrate 10 are composed entirely of a same semiconductor material. In one example, the semiconductor fins 12 and the semiconductor substrate 10 are entirely composed of silicon. In another embodiment, the semiconductor fins 12 are composed of a different semiconductor material than at least the uppermost portion of the semiconductor substrate 10. In one example, the semiconductor fins 12 are composed of silicon, while at least the uppermost portion of the semiconductor substrate 10 is composed a silicon germanium alloy.

Each hard mask cap 14 is composed of a dielectric hard mask material such as, for example, silicon dioxide, silicon nitride and/or silicon oxynitride. In one example, silicon nitride is employed as the dielectric hard mask material of each hard mask cap 14. As is shown, the hard mask cap 14 has sidewall surfaces that are vertically aligned to sidewall surfaces of the underlying semiconductor fin 12.

The exemplary semiconductor structure can be formed by first providing a hard mask layer (not shown) onto a surface of a base semiconductor substrate (not shown). The base semiconductor substrate is typically a bulk semiconductor substrate. By "bulk" it is meant that the base semiconductor substrate is entirely composed of at least one semiconductor material having semiconducting properties. The base semiconductor substrate may include at least one of the semiconductor materials mentioned above for semiconductor substrate 10, and the hard mask layer may include one of the dielectric hard mask materials mentioned above for the hard mask caps 14.

The hard mask layer may be formed utilizing a deposition process such as, for example, chemical vapor deposition (CVD) or plasma enhanced chemical vapor deposition (PECVD). In some embodiments, the hard mask layer may be formed by a thermal growth process such as, for example, thermal oxidation and/or thermal nitridation. In yet other embodiments, the hard mask layer may be formed utilizing a combination of, and in any order, a deposition process and a thermal growth process. The hard mask layer is a continuous layer (without any breaks or gaps) whose thickness may be from 20 nm to 100 nm. Other thicknesses that are lesser than, or greater than the aforementioned thicknesses values may also be employed as the thickness of the hard mask layer.

The hard mask layer and an upper semiconductor material portion of the base semiconductor substrate are then patterned to provide the exemplary semiconductor structure shown in FIG. 1.

In one embodiment, the patterning of the hard mask layer and the upper semiconductor material portions of the base semiconductor substrate may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the hard mask layer. In other embodiments, the patterned photoresist is removed from the structure after the pattern has been transferred into both the hard mask layer and the upper semiconductor material portion of the base semiconductor substrate. In either embodiment, the patterned photoresist may be removed utilizing a conventional photoresist stripping process such as, for example, ashing.

In another embodiment, the patterning of the hard mask layer and the upper semiconductor material portion of the base semiconductor substrate may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the hard mask layer and the upper semiconductor material portion of the base semiconductor substrate may include a direct self-assembly (DSA) process in which a copolymer that is capable of direct self-assembly is used.

Figure 2:
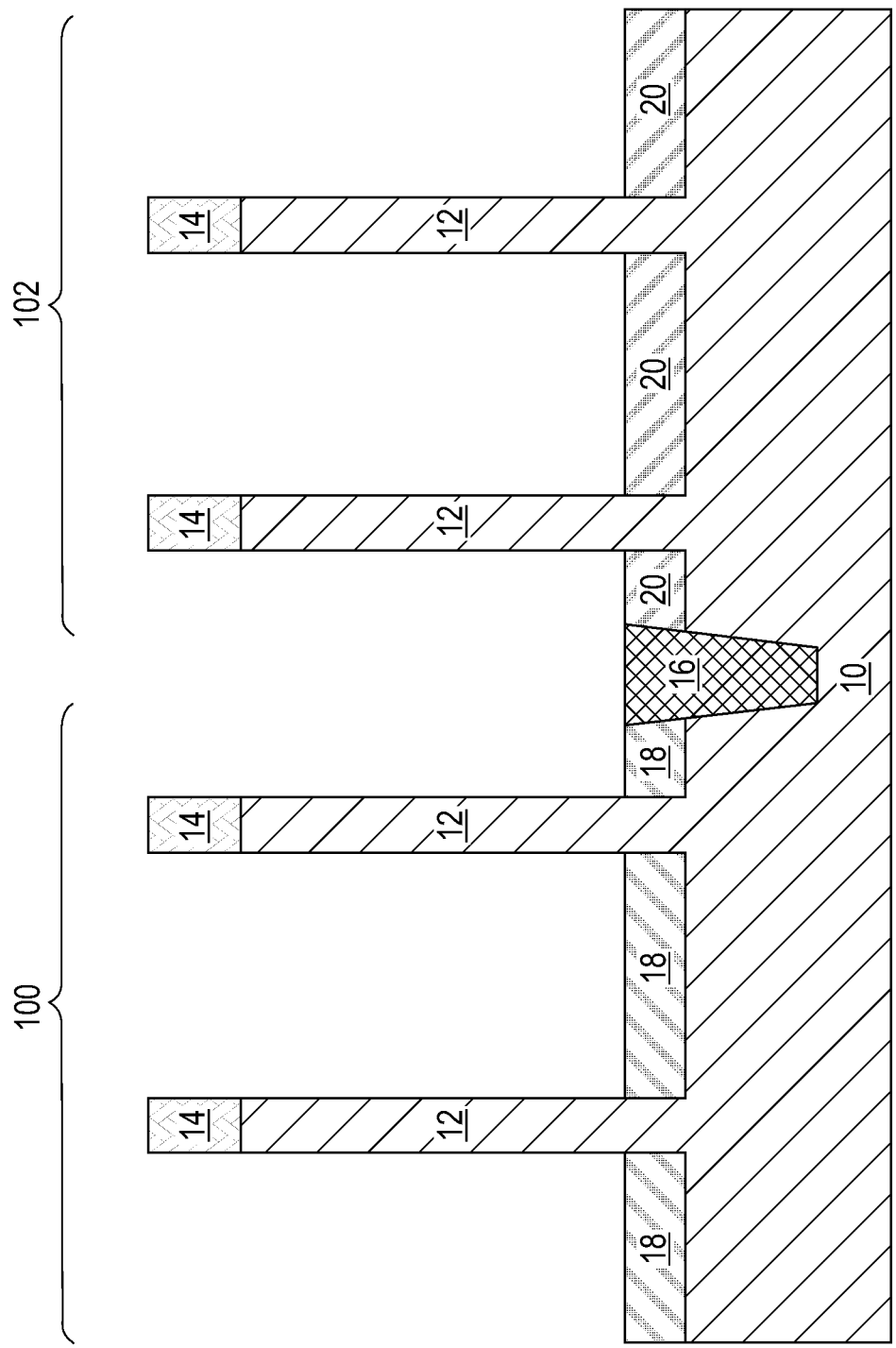
FIG. 2 is a cross sectional view of the exemplary semiconductor structure of FIG. 1 after forming a bottom nFET drain region contacting a sidewall surface of a bottom portion of each semiconductor fin present in the nFET device region, and a bottom pFET drain region contacting a sidewall surface of a bottom portion of each semiconductor fin present in the pFET device region, and forming an isolation structure between the different device regions.

Referring now to FIG. 2, there is illustrated the exemplary semiconductor structure of FIG. 1 after forming a bottom nFET drain region contacting a sidewall surface of a bottom portion each semiconductor fin 12 present in the nFET device region 100, and a bottom pFET drain region 20 contacting a sidewall surface of a bottom portion of each semiconductor fin 12 present in the pFET device region 102, and forming an isolation structure 16 between the different device regions (100/102).

The bottom nFET drain region 18 and the bottom pFET drain region 20 can be formed in any order, and on a physically exposed surface of the semiconductor substrate 10. In one embodiment, the bottom nFET drain region 18 can be formed prior to the bottom pFET drain region 20. In such an embodiment, a block mask is formed in the pFET device region 102 and then the bottom nFET drain region 18 is formed by an epitaxial deposition or growth process. Following the epitaxial deposition or growth of the bottom nFET drain region 18, the block mask is removed from the pFET device region 102, another block mask is formed in the nFET device region 100 that now includes the bottom nFET drain region 18, and thereafter the bottom pFET drain region 20 is formed by another epitaxial deposition or growth process. Following epitaxial deposition or growth of the bottom pFET drain region 20, the other block mask is removed from the nFET device region 100. In embodiments in which the bottom pFET drain region 20 is formed prior to the bottom nFET drain region 18, the order of the above mentioned processing steps is reversed.

The bottom nFET drain region 18 includes a semiconductor material (as defined above) and an n-type dopant. The semiconductor material that provides the bottom nFET drain region 18 may be the same as, or different from, the semiconductor material of semiconductor substrate 10. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the semiconductor material that provides the bottom nFET drain region 18 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The bottom nFET drain region 18 has a height that is less than a height of each of the semiconductor fins 12 in the nFET device region 100. The bottom nFET drain region 18 contacts a sidewall surface of a bottom portion of the semiconductor fins 12 that are present in the nFET device region 100.

The bottom pFET drain region 20 includes a semiconductor material (as defined above) and a p-type dopant. The semiconductor material that provides the bottom pFET drain region 20 may be the same as, or different from, the semiconductor material of semiconductor substrate 10. Also, the semiconductor material that provides the bottom pFET drain region 20 may be the same as, or different from, the semiconductor material that provides the n-doped semiconductor drain region 18. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the semiconductor material that provides the bottom pFET drain region 20 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The bottom pFET drain region 20 has a height that is less than a height of each of the semiconductor fins 12 in the pFET device region 102. The bottom pFET drain region 20 contacts a sidewall surface of a bottom portion of the semiconductor fins 12 that are present in the pFET device region 102. The bottom pFET drain region 20 may have a topmost surface that is coplanar with a topmost surface of the bottom nFET drain region 18.

As mentioned above, the bottom nFET drain region 18 and bottom pFET drain region 20 can be formed utilizing an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the bottom nFET drain region 18 and bottom pFET drain region 20 have an epitaxial relationship with the physically exposed surface of the semiconductor substrate 10 and the sidewall surfaces of each semiconductor fin 12.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined below) is typically added to the precursor gas or gas mixture.

In some embodiments, isolation structure 16 can be formed between the different device regions (100/102). The isolation structure 16 can be formed by forming a trench opening in an area in which sidewalls of the bottom nFET drain region 18 and bottom pFET drain region 20 are in contact with each other, and then filling the trench opening with a trench dielectric material such as, for example, silicon dioxide. A recess etch may follow the trench filling step. Although the present application describes forming the isolation structure 16 after forming the bottom nFET drain region 18 and bottom pFET drain region 20, the isolation structure 16 may be formed prior to forming the bottom nFET drain region 18 and the bottom pFET drain region 20.

Figure 3:
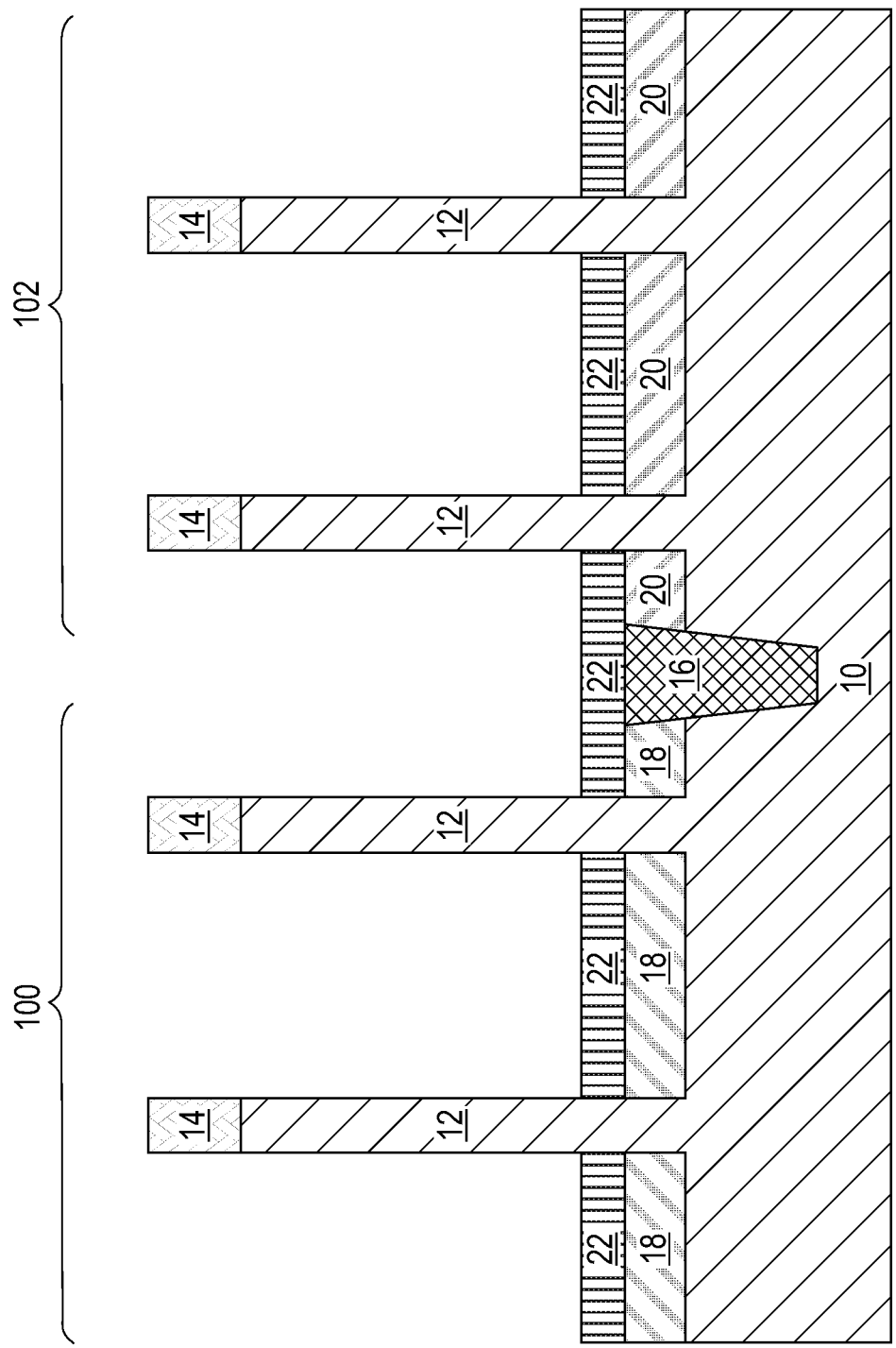
FIG. 3 is a cross sectional view of the exemplary semiconductor structure of FIG. 2 after forming a bottom spacer layer on the bottom nFET drain region and on the bottom pFET drain region.

Referring now to FIG. 3, there is illustrated the exemplary semiconductor structure of FIG. 2 after forming a bottom spacer layer 22 on the bottom nFET drain region 18 and on the bottom pFET drain region 20. In embodiments in which the isolation structure 16 is present, the bottom spacer layer 22 may also be formed on the isolation structure 16.

The bottom spacer layer 22 contacts a sidewall surface of the bottom portion of the semiconductor fins 12 present in each of the device regions (100/102). The bottom spacer layer 22 may be composed of any dielectric spacer material including for example, silicon dioxide, silicon nitride or silicon oxynitride; the bottom spacer layer 22 is compositionally different from the hard mask caps 14. The bottom spacer layer 22 may be formed utilizing a deposition process such as, for example, chemical vapor deposition or plasma enhanced chemical vapor deposition. In some instances, an etch back process may follow the deposition of the dielectric spacer material that provides the bottom spacer layer 22. The bottom spacer layer 22 may have a thickness from 4 nm to 10 nm. Other thicknesses that are lesser than, or greater than, the aforementioned thickness range may also be employed in the present application as the thickness of the bottom spacer layer 22 as long as the height of the bottom spacer 22 is not greater than the height of the semiconductor fins 12 and there is sufficient area on each the semiconductor fins 12 to form other components of a vertical transport FET.

Figure 4:
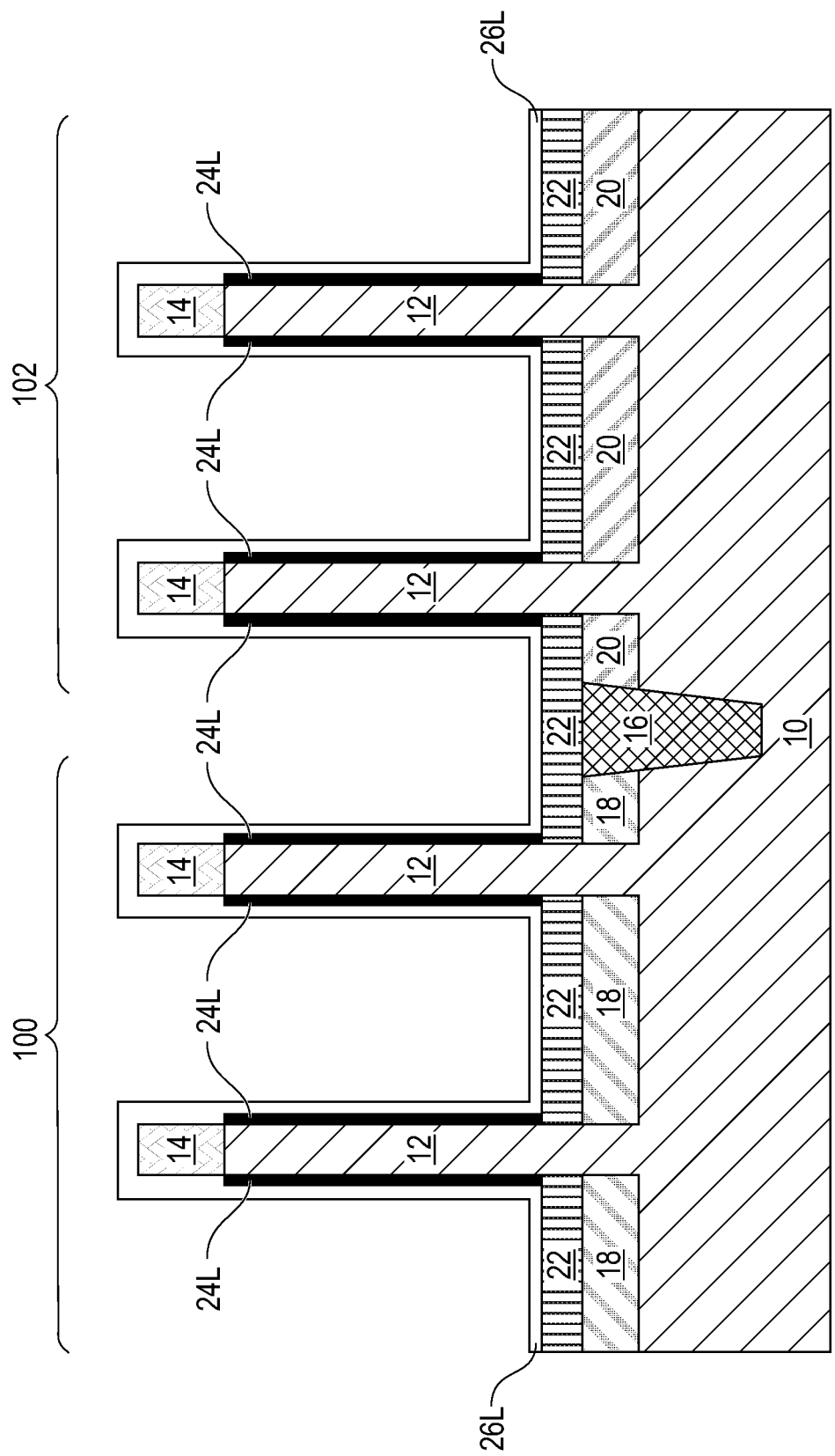
FIG. 4 is a cross sectional view of the exemplary semiconductor structure of FIG. 3 after forming an interfacial dielectric material layer on a physically exposed sidewall surface of each semiconductor fin present in the nFET and pFET device regions, and forming a high-k gate dielectric material layer.

Referring now to FIG. 4, there is illustrated the exemplary semiconductor structure of FIG. 3 after forming an interfacial dielectric material layer 24L on a physically exposed sidewall surface of each semiconductor fin 12 present in the nFET and pFET device regions (100, 102), and forming a high-k gate dielectric material layer 26L. As is shown, the interfacial dielectric material layer 24L is formed on the sidewalls of each semiconductor fin 12; no interfacial dielectric material layer 24L is present on the hard mask caps 14.

The interfacial dielectric material layer 24L is composed of an oxide of the semiconductor material of the semiconductor fins 12. In one example, the interfacial dielectric material layer 24L is composed of silicon dioxide. The interfacial dielectric material layer 24L can be formed utilizing a thermal oxidation (i.e., growth) process. The interfacial dielectric material layer 24L may have a thickness from 0.5 nm to 2.0 nm.

As is shown, the high-k gate dielectric material layer 26L is a continuous layer that is formed laterally adjacent to a sidewall surface of each semiconductor fin 12 and each hard mask cap 14 present in the nFET and pFET device regions (100, 102), as well as on the topmost surface of each hard mask cap 14 and a topmost surface of the bottom spacer layer 22. The term "high-k gate dielectric material" denotes a gate dielectric material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high-k gate dielectric material layer 26L can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the high-k gate dielectric material layer 26L can have a thickness in a range from 1 nm to 10 nm. Other thicknesses that are lesser than, or greater than, the aforementioned thickness range can also be employed for high-k gate dielectric material layer 26L. The high-k gate dielectric material layer 26L is typically a conformal layer.

Figure 5:
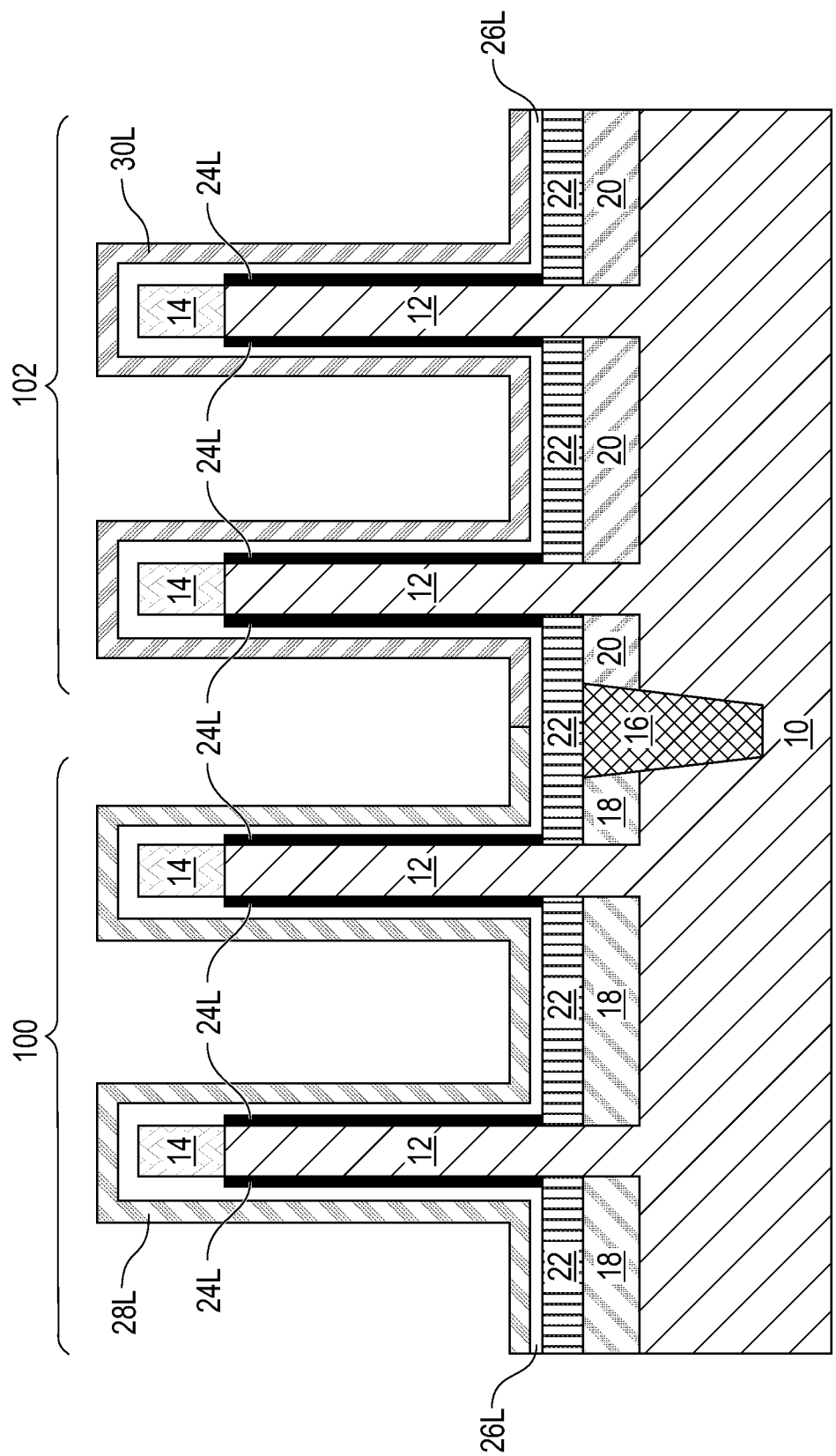
FIG. 5 is a cross sectional view of the exemplary semiconductor structure of FIG. 4 after forming a first material stack containing an nFET dipole element containing layer on the high-k gate dielectric material layer in the nFET device region, and forming a second material stack containing a pFET dipole element containing layer on the high-k dielectric material layer and in the pFET device region.

Referring now to FIG. 5, there is illustrated the exemplary semiconductor structure of FIG. 4 after forming a first material stack 28L containing an nFET dipole element containing layer on the high-k gate dielectric material layer 26L in the nFET device region 100, and forming a second material stack 30L containing a pFET dipole element containing layer on the high-k dielectric material layer 26L and in the pFET device region 102. The first and second material stacks (28L, 30L) can be formed in any order utilizing block mask technology to block one device region, while processing the non-blocked device region to include the appropriate material stack.

The first material stack 28L includes an nFET dipole element containing layer that is located between top and bottom metal nitride barrier layers; the individual layers of the first material stack 28L and the second material stack 30L are not shown in the drawings. The top and bottom metal nitride barrier layers of the first material stack 28L may be composed of TiN or TaN. The top and bottom metal nitride barrier layers of the first material stack 28L may be formed by a deposition process such as, for example, chemical vapor deposition (CVD), plasma enhanced chemical vapor deposition (PECVD), physical vapor deposition (PVD), sputtering, or atomic layer deposition (ALD). The top and bottom metal nitride barrier layers of the first material stack 28L may have a thickness from 0.5 nm to 3.0 nm.

The nFET dipole element containing layer of the first material stack 28L is composed of an oxide of a Group IIA (i.e., Group 2) element of the Periodic Table of Elements, or an oxide of a Group IIIB (i.e., Group 3) element of the Periodic Table of Elements. All Group IIA and Group IIIB elements are nFET like compared to the high-k gate dielectric material layer 26L. Thus, Group IIA and Group IIIB elements will provide a negative threshold voltage shift to an nFET device. Some examples of nFET dipole element containing layers that can be employed in the present application include, but are not limited to, magnesium oxide (MgO), or lanthanum oxide (LaO).

The nFET dipole element containing layer of the first material stack 28L can be formed utilizing a deposition process such as, for example, chemical vapor deposition (CVD), plasma enhanced chemical vapor deposition (PECVD), physical vapor deposition (PVD), sputtering, or atomic layer deposition (ALD). The nFET dipole element containing layer of the first material stack 28L may have a thickness from 0.5 nm to 3.0 nm.

The second material stack 30L includes a pFET dipole element containing layer that is located between top and bottom metal nitride barrier layers. The top and bottom metal nitride barrier layers of the second material stack 30L may be composed of TiN or TaN. The top and bottom metal nitride barrier layers of the second material stack 30L may be formed by a deposition process such as, for example, chemical vapor deposition (CVD), plasma enhanced chemical vapor deposition (PECVD), physical vapor deposition (PVD), sputtering, or atomic layer deposition (ALD). The top and bottom metal nitride barrier layers of the second material stack 30L may have a thickness from 0.5 nm to 3.0 nm.

The pFET dipole element containing layer of the second material stack 30L is composed of aluminum oxide. The aluminum oxide is pFET like compared to the high-k gate dielectric material layer 26L. Thus, the aluminum oxide will provide a positive threshold voltage shift to a pFET device.

The pFET dipole element containing layer of the second material stack 30L can be formed utilizing a deposition process such as, for example, chemical vapor deposition (CVD), plasma enhanced chemical vapor deposition (PECVD), physical vapor deposition (PVD), sputtering, or atomic layer deposition (ALD). The pFET dipole element containing layer of the second material stack 30L may have a thickness from 0.5 nm to 3.0 nm.

In some embodiments of the present application (and as is illustrated in FIG. 5), the first material stack 28L and the second material stack 30L have non-overlapping end portions that contact each. In other embodiments of the present application (not illustrated), the first material stack 28L has an end portion that may overlap, or underlap, the end portion of the second material stack 30L.

Figure 6:
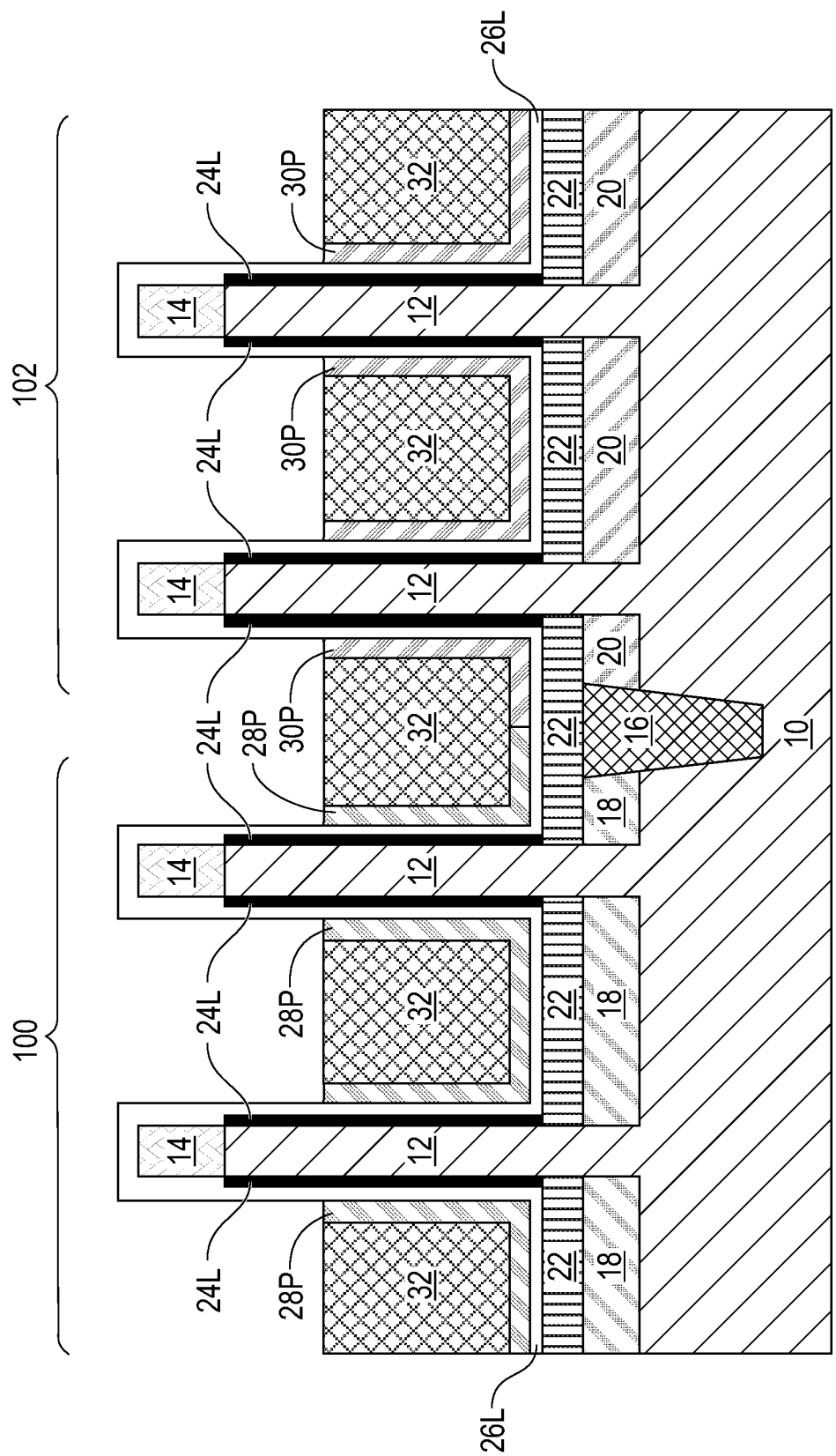
FIG. 6 is a cross sectional view of the exemplary semiconductor structure of FIG. 5 after forming a first recessed sacrificial material layer on the first and second material stacks, and between each semiconductor fin present in the nFET and pFET device regions, and removing the first and second material stacks not covered by the first recessed sacrificial material layer.

Referring now to FIG. 6, there is illustrated the exemplary semiconductor structure of FIG. 5 after forming a first recessed sacrificial material layer 32 on the first and second material stacks (28L, 30L), and between each semiconductor fin 12 present in the nFET and pFET device regions (100, 102), and removing the first and second material stacks (28L, 30L) not covered by the first recessed sacrificial material layer 32. The remaining portion of the first material stack may be referred to herein as a first material stack portion 28P, while the remaining portion of the second material stack may be referred to herein as a second material stack portion 30P. At this point of the present application, the first and second material stack portions (28P, 30P) are covered by the first recessed sacrificial material layer 32. As is shown in FIG. 6, each of the first and second material stack portions (28P, 30P) has a topmost surface that is coplanar with a topmost surface of first recessed sacrificial material layer 32.

The first recessed sacrificial material layer 32 is composed of a material that has a different etch selectivity than the first and second material stacks (28L, 30L). In one embodiment, the first recessed sacrificial material layer 32 is composed of an organic planarization layer (OPL). The first recessed sacrificial material layer 32 can formed by deposition of a dielectric material, and thereafter performing a recess etch. The first recessed sacrificial material layer 32 has height that is less than the height of each semiconductor fin 12. In one embodiment, the first recessed sacrificial material layer 32 has a height from 10 nm to 30 nm.

The physically exposed portions of the first and second material stacks (28L, 30L) not covered by the first recessed sacrificial material layer 32 are then removed utilizing an etch that is selective in removing the first material stack 28L and the second material stack 30L. In one embodiment, a single etch may be used to simultaneously remove both the first and second material stacks (28L, 30L). In another embodiment, two different etching processes, one which is selective in removing the first material stack 28L and the other that is selective in removing the second material stack 30L, may be used. In such an embodiment, the order of removing the physically exposed portions of the first and second material stacks (28L, 30L) may vary. For example, the physically exposed portion of the first material stack 28L may be removed prior to the removal of the physically exposed portion of the second material stack 30L. In another example, the physically exposed portion of the second material stack 30L may be removed prior to the removal of the physically exposed portion of the first material stack 28L.

After removing the physically exposed portions of the first and second material stacks (28L, 30L) not covered by the first recessed sacrificial material layer 32, an upper portion of the high-k gate dielectric material layer 26L that is present along an upper portion of the sidewalls of each semiconductor fin 10 and each hard mask cap 14 is now physically exposed.

Figure 7:
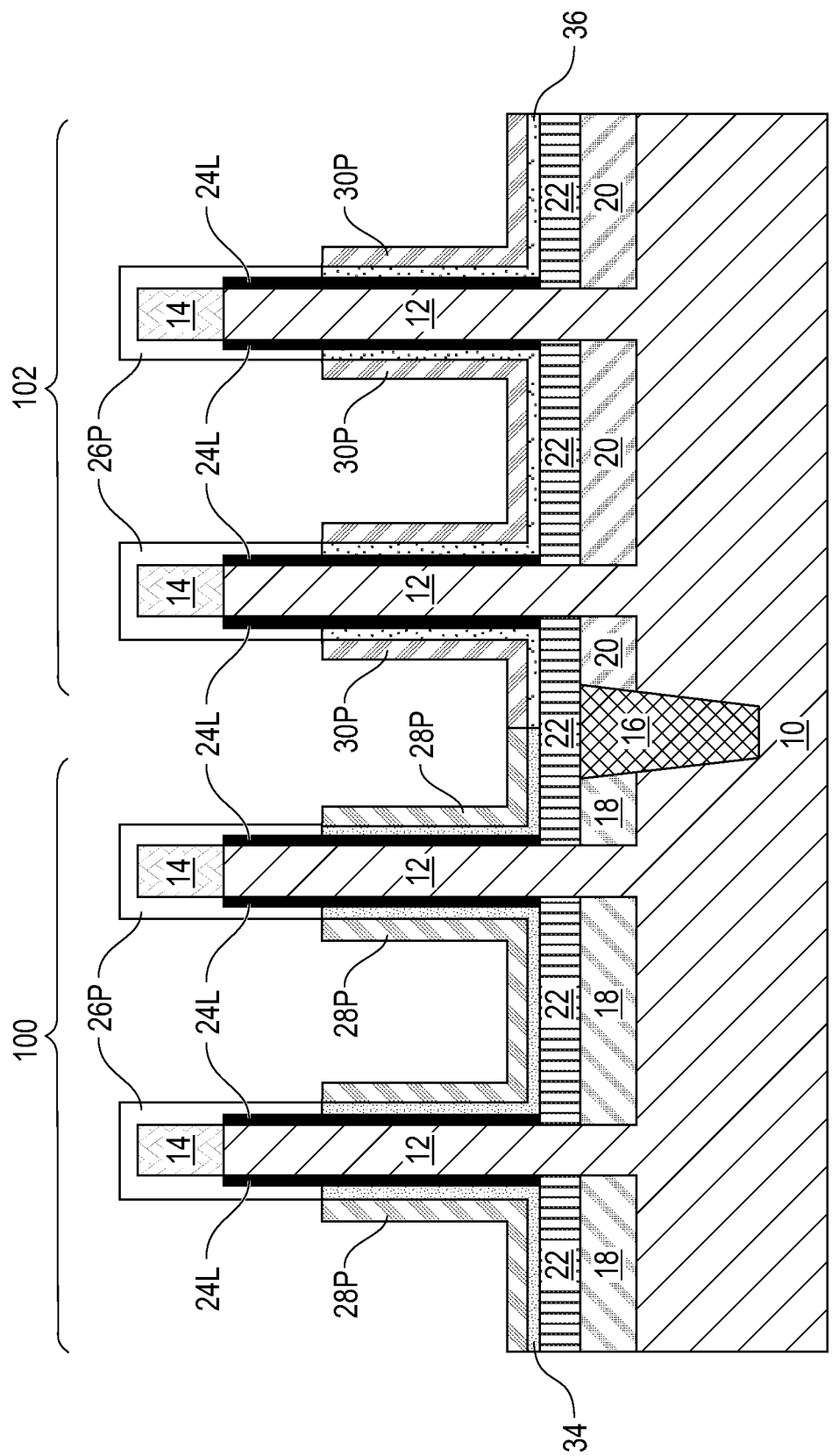
FIG. 7 is a cross sectional view of the exemplary semiconductor structure of FIG. 6 after removing the first recessed sacrificial material layer, and performing a drive-in anneal, wherein the drive-in anneal introduces the nFET dipole element of the remaining portion of the nFET dipole element containing layer into an adjacent portion of the high-k dielectric material layer to provide a doped high-k dielectric portion containing the nFET dipole element, and the pFET dipole element of the remaining portion of the pFET dipole element containing layer into an adjacent portion of the high-k dielectric material layer to provide a doped high-k dielectric portion containing the pFET dipole element.

Referring now to FIG. 7, there is illustrated the exemplary semiconductor structure of FIG. 6 after removing the first recessed sacrificial material layer 32, and performing a drive-in anneal. The removal of the first recessed sacrificial material layer 32 can be performed utilizing a material removal process such as, for example, an etch, that is selective in removing the first recessed sacrificial material layer 32.

After removing first recessed sacrificial material layer 32, a drive-in anneal is performed. In some embodiments, and prior to performing the drive-in anneal, a material stack (not shown) composed of amorphous silicon and a metal nitride diffusion barrier layer is formed on the physically exposed first material stack portion 28P and/or the physically exposed second material stack portion 30P. In such an embodiment, the material stack including the amorphous silicon layer and the metal nitride diffusion barrier layer may be formed by deposition of amorphous silicon and deposition of a metal nitride.

In accordance with the present application, the drive-in anneal introduces (via diffusion) the nFET dipole element of the remaining portion of the nFET dipole element containing layer of the first material stack portion 28P into an adjacent portion of the high-k dielectric material layer 26L to provide a doped high-k gate dielectric portion containing the nFET dipole element, and the pFET dipole element of the remaining portion of the pFET dipole element containing layer of the second material stack portion 30P into an adjacent portion of the high-k dielectric material layer 26L to provide a doped high-k dielectric portion containing the pFET dipole element.

A portion of the high-k gate dielectric material layer 26L that is present along the sidewalls of an upper portion of the semiconductor fins 12 and the physically exposed surfaces of each hard mask cap 14 remains non-doped. The non-doped high-k gate dielectric material portion is designated as element 26P. The non-doped high-k gate dielectric material portion 26P does not include any Group IIA element, IIIB element, or aluminum as defined above.

The doped high-k gate dielectric portion containing the nFET dipole element may be referred to herein as an nFET doped interface high-k gate dielectric material 34, while the doped high-k gate dielectric portion containing the pFET dipole element may be referred to herein as a pFET doped interface high-k gate dielectric material 36.

The nFET doped interface high-k gate dielectric material 34 contains a high-k gate dielectric material, as mentioned above, and an element from Group IIA or Group IIIB of the Periodic Table of Elements, as also mentioned above. The content of the element from Group IIA or Group IIIB of the Periodic Table of Elements that is present in the nFET doped interface high-k gate dielectric material 34 may range from $1E14$ atoms/cm$^2$ to $1E15$ atoms/cm$^2$. The content of the Group IIA or IIIB element in the remaining portion of the nFET dipole element containing layer of the first material stack portion 28P may be reduced from its original content.

The pFET doped interface high-k gate dielectric material 36 contains aluminum. The content of aluminum that is present in the pFET doped interface high-k gate dielectric material 36 may range from $1E14$ atoms/cm$^2$ to $1E15$ atoms/cm$^2$. The content of aluminum in the remaining portion of the pFET dipole element containing layer of the second material stack portion 30P may be reduced from its original content.

The drive-in anneal may be performed at a temperature of 900° C. or greater. In one embodiment, the drive-in anneal may be performed at a temperature from 1050° C. to 1450° C. The drive-in anneal is performed in an inert ambient such as, for example, helium, argon, neon, and/or nitrogen. The duration of the drive-in anneal may vary. In one example, the duration of the drive-in anneal is from 1 ms to 1 s. After the drive-in anneal, and if present, the material stack of the amorphous silicon layer and the metal nitride diffusion barrier is removed from the structure utilizing a material removal process such as, for example, etching, that is selective in removing such a material stack.

Figure 8:
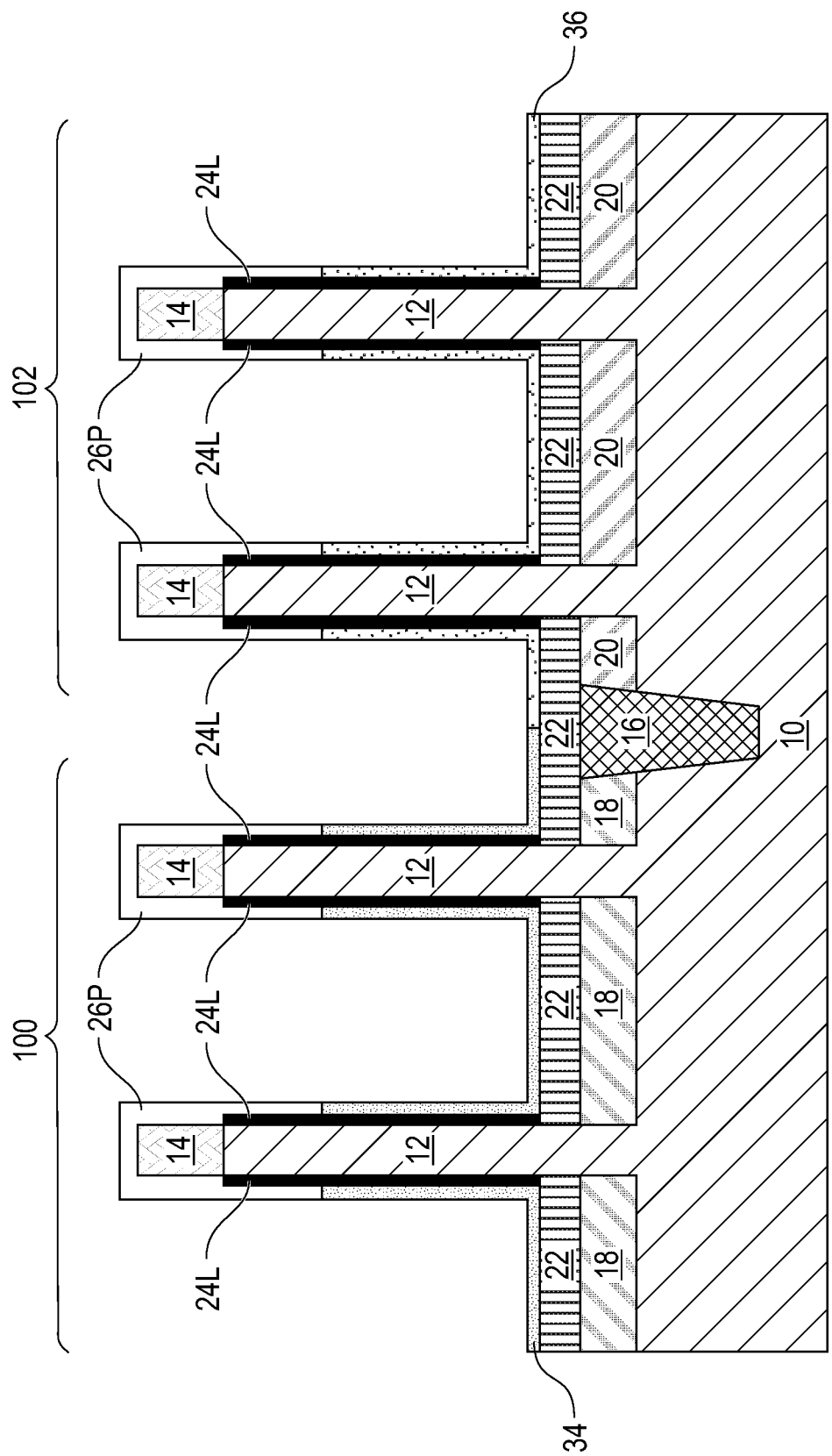
FIG. 8 is a cross sectional view of the exemplary semiconductor structure of FIG. 7 after removing a remaining portion of the first material stack, and a remaining portion of the second material stack.

Referring now to FIG. 8, there is illustrated the exemplary semiconductor structure of FIG. 7 after removing the remaining portion of the first material stack (i.e., the first material stack portion 28P), and the remaining portion of the second material stack (i.e., the second material stack portion 30P). The removal of the first material stack portion 28P and the second material stack portion 30P may be performed utilizing an etch that is selective in removing the first material stack portion 28P and the second material stack portion 30P. In one embodiment, a single etch may be used to simultaneously remove both the first and second material stack portions (28P, 30P). In another embodiment, two different etching processes, one which is selective in removing the first material stack portion 28P and the other that is selective in removing the second material stack portion 30P, may be used. In such an embodiment, the order of removing the first and second material stack portions (28P, 30P) may vary. For example, the first material stack portion 28P may be removed prior to the removal of the second material stack portion 30P. In another example, the second material stack portion 30P may be removed prior to the removal of the first material stack portion 28P.

After removal of the first and second material stack portions (28P, 30P), the nFET doped interface high-k gate dielectric material 34, and the pFET doped interface high-k gate dielectric material 36 are physically exposed.

Figure 9:
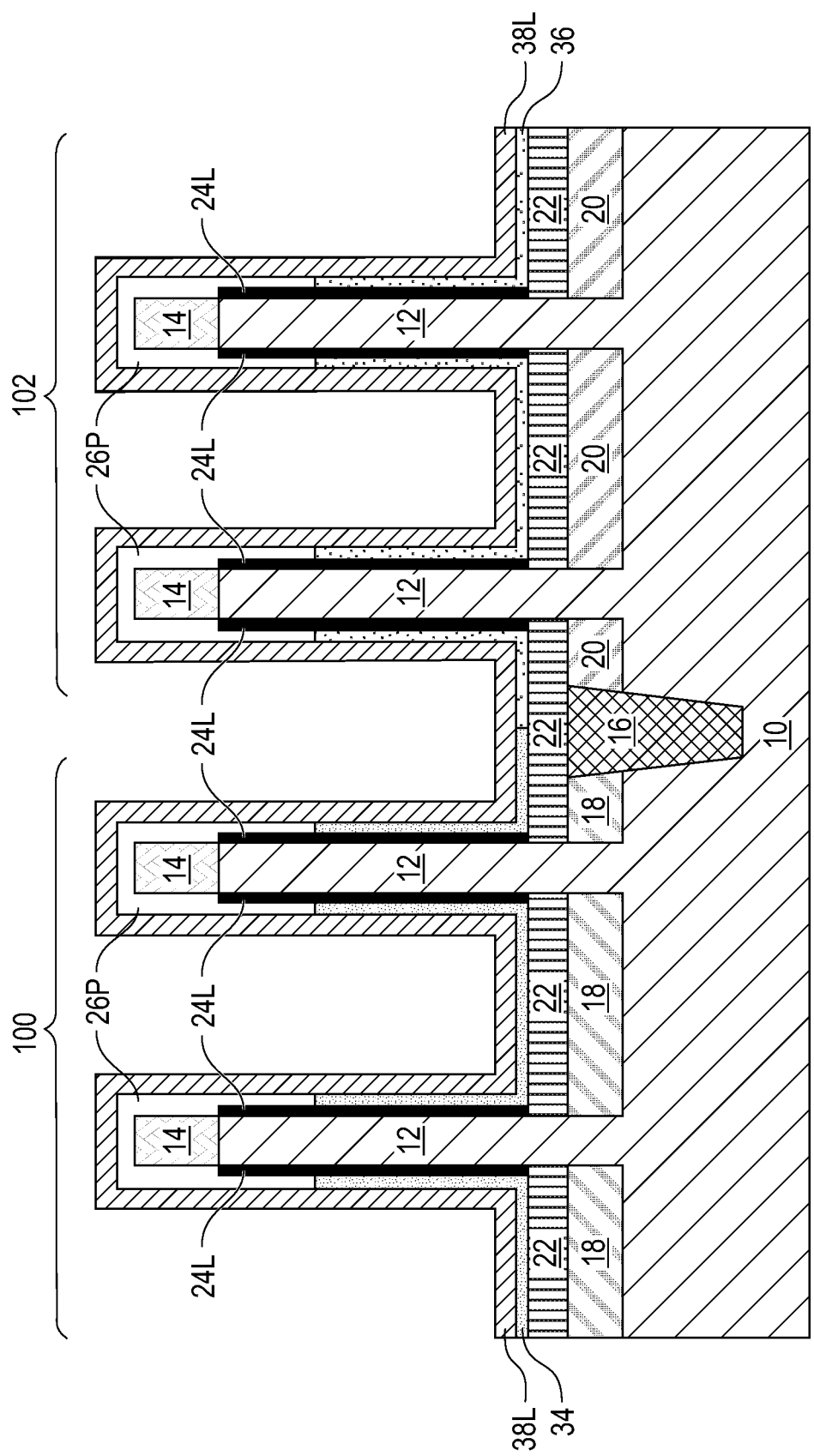
FIG. 9 is a cross sectional view of the exemplary semiconductor structure of FIG. 8 after forming a workfunction metal layer.

Referring now to FIG. 9, there is illustrated the exemplary semiconductor structure of FIG. 8 after forming a workfunction metal layer 38L. As the illustrated embodiment, the workfunction metal layer 38L is a continuous layer that is present on the physically exposed nFET doped interface high-k gate dielectric material 34, pFET doped interface high-k gate dielectric material 36, and non-doped high-k gate dielectric material portion 26P. In such an embodiment, the workfunction metal layer 38L is composed of a single workfunctional metal that is present in the nFET device region 100 and the pFET device region 102. The single workfunction metal that can provide the workfunction metal layer 38L may include a p-type work functional metal or an n-type workfunction metal. P-type work function metals include compositions such as ruthenium, palladium, platinum, cobalt, nickel, and conductive metal oxides, metal nitrides, such as titanium nitride, tantalum nitride, or any combination thereof. N-type workfunction metal materials include compositions such as hafnium, zirconium, titanium, tantalum, aluminum, metal carbides (e.g., hafnium carbide, zirconium carbide, titanium carbide, and aluminum carbide), aluminides, or any combination thereof. In one example, the workfunction metal layer 38L is composed of a p-type workfunction TiN layer.

In some embodiments (not shown), an n-type workfunction metal layer is formed in the nFET device region, while a p-type workfunction metal layer is formed in the pFET device region. In such an embodiment, block mask technology may be used to provide the 'dual' workfunction metal layers to the exemplary structure shown in FIG. 9.

The workfunction metal layer 38L may be formed utilizing a deposition process such as, for example, chemical vapor deposition (CVD), plasma enhanced chemical vapor deposition (PECVD) or atomic layer deposition (ALD). In some embodiments, an anneal may be performed after the deposition of the workfunction metal layer 38L. When employed, the anneal may be a furnace anneal or a laser anneal. The anneal may be performed at a temperature from 800° C. to 1100° C. and in an inert ambient such as, for example, helium, argon and/or neon.

In one embodiment of the present application, the workfunction metal layer 38L can have a thickness in a range from 5 nm to 20 nm. Other thicknesses that are lesser than, or greater than, the aforementioned thickness range can also be employed for the gate dielectric material that provides the workfunction metal layer 38L.

Figure 10:
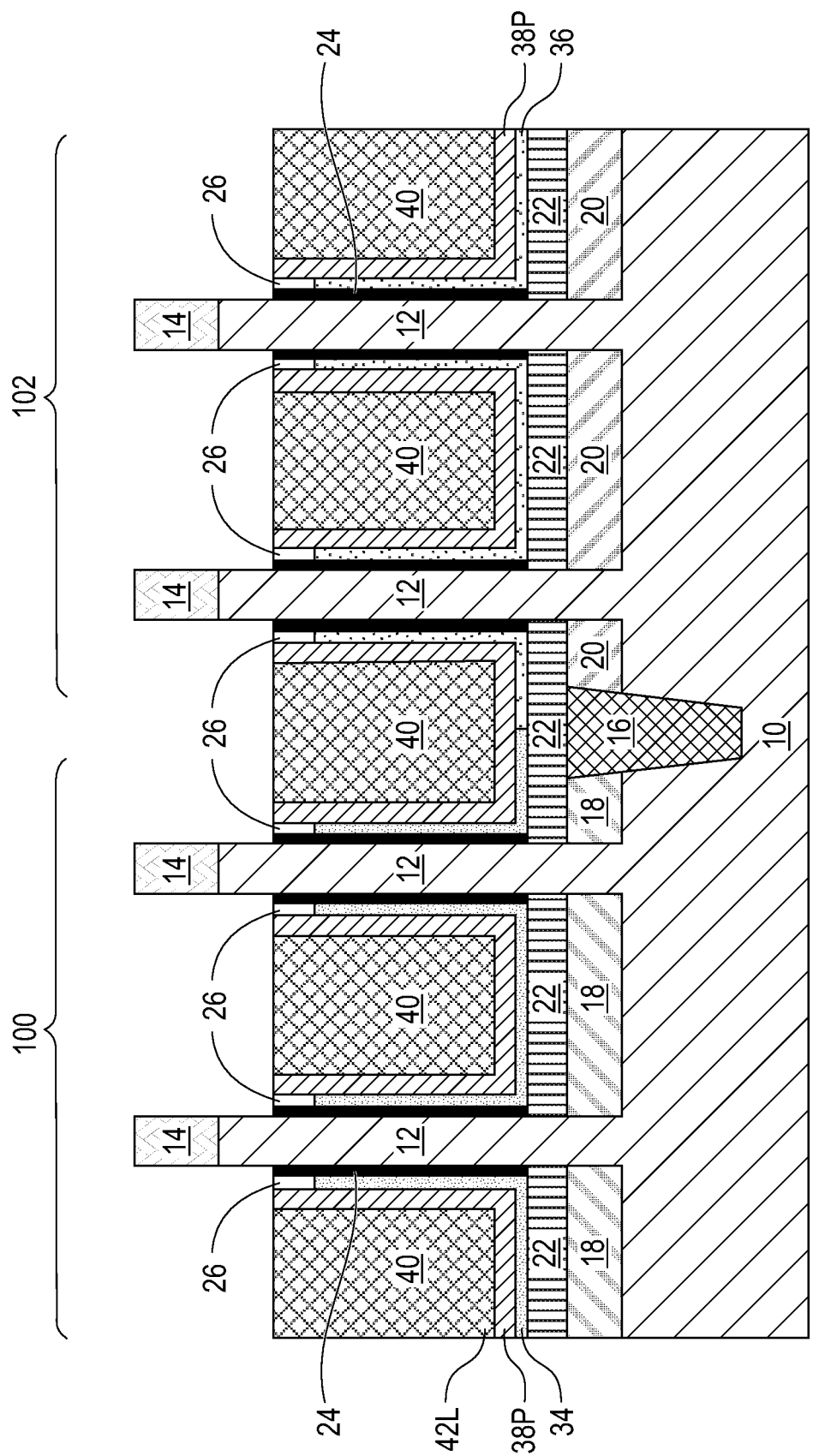
FIG. 10 is a cross sectional view of the exemplary semiconductor structure of FIG. 9 after forming a second recessed sacrificial material layer on the workfunction metal layer, and between each semiconductor fin present in the nFET device region and the pFET device region, and removing physically exposed portions of the workfunction metal layer, the high-k dielectric material layer, and the interfacial dielectric material layer.

Referring now to FIG. 10, there is illustrated the exemplary semiconductor structure of FIG. 9 after forming a second recessed sacrificial material layer 40 on the workfunction metal layer 38L, and between each semiconductor fin 12 present in the nFET device region 100 and the pFET device region 102, and removing physically exposed portions of the workfunction metal layer 38L, the high-k dielectric material layer (i.e., the non-doped high-k gate dielectric material portion 26P), and the interfacial dielectric material layer 24L.

The second recessed sacrificial material layer 40 may include one of the materials as mentioned above for the first recessed sacrificial material layer 32. The second recessed sacrificial material layer 40 may be formed by deposition and etching as were mentioned above for forming the first recessed sacrificial material layer. The second recessed sacrificial material layer 40 has a height that is greater than the height of the nFET doped interface high-k gate dielectric material 34 and the pFET doped interface high-k gate dielectric material 36, but less than the height of each semiconductor fin 12.

The removal of the physically exposed portions of the workfunction metal layer 38L, the non-doped high-k gate dielectric material portion 26P, and the interfacial dielectric material layer 24L may be performed utilizing one or more etching process. A portion of the workfunction metal layer 38L, a portion of the non-doped high-k gate dielectric material portion 26P, and a portion of the interfacial dielectric material layer 24L remain. The remaining portion of the workfunction metal layer 28L is referred to herein as a workfunction gate electrode 38P, the remaining portion of the non-doped high-k gate dielectric material portion 26P is referred to herein as a non-doped high-k gate dielectric material 26, and the remaining portion of the interfacial dielectric material layer 24L is referred to herein as an interfacial dielectric material 24.

Collectively, the nFET doped interface high-k gate dielectric material 34 and the non-doped high-k gate dielectric material 26 that are present in the nFET device region 100 provide a gradient threshold voltage adjusting nFET gate dielectric structure, and collectively the pFET doped interface high-k gate dielectric material 36 and the non-doped high-k gate dielectric material 26 that are present in the pFET device region 102 provide a gradient threshold voltage adjusting pFET gate dielectric structure. These gate dielectric structures are located laterally adjacent a sidewall surface of a middle portion of each semiconductor fin 12 in their respective device regions (100, 102).

As is shown, the workfunction gate electrode 38P in the nFET device region 100 is located laterally adjacent to, and in contact with, the gradient threshold voltage adjusting nFET gate dielectric structure (34, 26), while the workfunction gate electrode 38P in the pFET device region 102 is located laterally adjacent to, and in contact with, the gradient threshold voltage adjusting pFET gate dielectric structure (36, 26). As is further shown, the workfunction gate electrode 38P in the nFET device region 100 has a topmost surface that is coplanar with a topmost surface of the non-doped high-k gate dielectric material 26 of the gradient threshold voltage adjusting nFET gate dielectric structure (34, 26), while the workfunction gate electrode 38P in the pFET device region 102 has a topmost surface that is coplanar with a topmost surface of the non-doped high-k gate dielectric material 26 of the gradient threshold voltage adjusting pFET gate dielectric structure (36, 26).

As shown in FIG. 10, the sidewall surface of an upper portion of each semiconductor fins 12 are physically exposed after the removal of the physically exposed portions of the workfunction metal layer 38L and the non-doped high-k gate dielectric material portion 26P.

Figure 11:
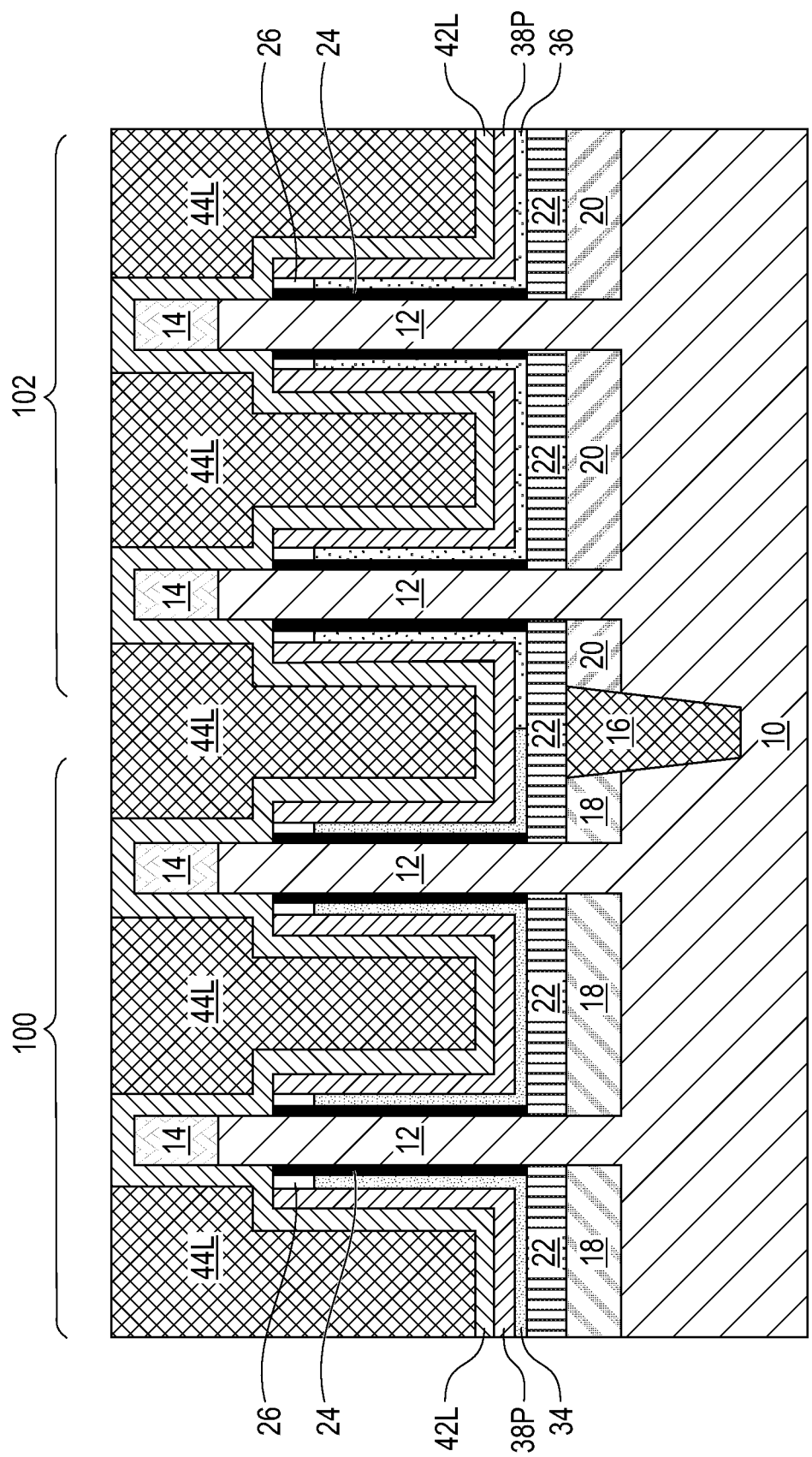
FIG. 11 is a cross sectional view of the exemplary semiconductor structure of FIG. 10 after removing the second recessed sacrificial material layer, and forming a gate encapsulation layer, and a middle-of-the-line (MOL) dielectric material.

Referring now to FIG. 11, there is illustrated the exemplary semiconductor structure of FIG. 10 after removing the second recessed sacrificial material layer 40, and forming a gate encapsulation layer 42L, and a middle-of-the-line (MOL) dielectric material 44L. The second recessed sacrificial material layer 40 may be removed utilizing a material removal process as defined above for removing the first second recessed sacrificial material layer 32.

The gate encapsulation layer 42L includes a hard mask material that may be the same as, or different from, the hard mask material that provides the hard mask caps 14. In one example, the gate encapsulation layer 42L may have a thickness from 10 nm to 50 nm; although other thicknesses are possible and are not excluded from being used.

The MOL dielectric material 44 is then formed on the gate encapsulation layer 42L and laterally surrounds each of the semiconductor fins 12. At this point of the present application, the MOL dielectric material 44 has a topmost surface that is coplanar with a topmost surface of the gate encapsulation layer 42L. The MOL dielectric material 44 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 44. The use of a self-planarizing dielectric material as the MOL dielectric material 44 may avoid the need to perform a subsequent planarizing step.

In one embodiment, the MOL dielectric material 44 can be formed utilizing a deposition process including, for example, chemical vapor deposition (CVD), plasma enhanced chemical vapor deposition (PECVD), evaporation or spin-on coating. In some embodiments, a planarization process and/or an etch back process follows the deposition of the MOL dielectric material 44.

Figure 12:
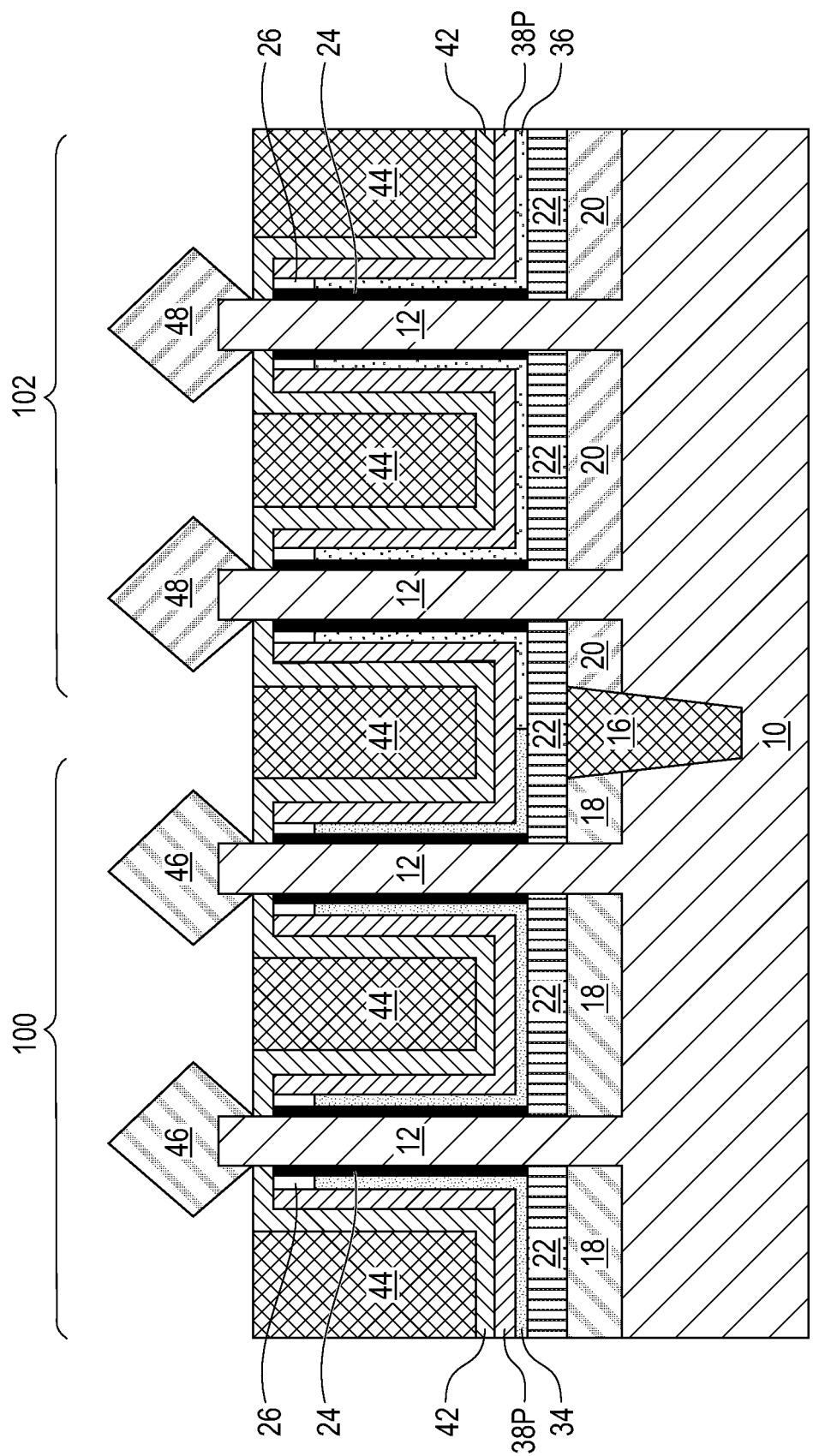
FIG. 12 is a cross sectional view of the exemplary semiconductor structure of FIG. 11 after exposing an upper portion of each semiconductor fin in the nFET device region and the pFET device region, and forming a top nFET source region on the exposed surfaces of the semiconductor fins in the nFET device region, and a top pFET source region on the exposed surfaces the semiconductor fins in the pFET device region.

Referring now to FIG. 12, there is illustrated the exemplary semiconductor structure of FIG. 11 after exposing an upper portion of each semiconductor fin 12 in the nFET device region 100 and the pFET device region 100, and forming a top nFET source region 46 on the exposed surfaces of the semiconductor fins 12 in the nFET device region 100, and a top pFET source region 48 on the exposed surfaces the semiconductor fins 12 in the pFET device region 102.

The exposing the upper portion of each semiconductor fin 12 in the nFET device region 100 and the pFET device region 102 includes first recessing an upper portion of the MOL dielectric material layer 44 utilizing a recess etching process. The remaining recessed MOL dielectric material layer 44 may be referred to herein as a MOL dielectric material structure 44. The physically exposed portion of the gate encapsulation layer 42 is then removed utilizing a selective etch to provide a gate encapsulation liner 42L. The gate encapsulation liner 42L has a topmost surface that is coplanar with a topmost surface of the MOL dielectric material structure 44.

Each hard mask cap 14 is then removed utilizing a material removal process such as, for example, etching or planarization. In some embodiments, and when the gate encapsulation layer 42L and the hard mask caps 14 are composed of a same hard mask material, a portion of the hard mask caps 14 may be removed during the etching of the gate encapsulation layer 42L. At this point of the present application, an upper portion (sidewalls and a topmost surface) of each semiconductor fin 12F is physically exposed.

The top nFET source region 46 and the top pFET source region 48 which can be formed utilizing an epitaxial growth (or deposition) process, as defined above, can be formed in any order. For example, and in one embodiment, the top nFET source region 46 can be formed prior to the top pFET source region 48. In such an embodiment, a block mask is formed in the pFET device region 102 and then the top nFET source region 46 is formed by epitaxial growth. Following the epitaxial growth of the top nFET source region 46, the block mask is removed from the pFET device region 102, another block mask is formed in the nFET device region 100 that now includes the top nFET source region 46, and thereafter the top pFET source region 48 is formed by epitaxial growth. Following epitaxial growth of the -doped semiconductor material source region 48, the another block mask is removed from the nFET device region 100. In embodiments, in which the top pFET source region 48 is formed prior to the top nFET source region 46, the order of the above mentioned processing steps is reversed.

The top nFET source region 46 includes a semiconductor material (as defined above) and an n-type dopant (as also defined above). The semiconductor material that provides the top nFET source region 46 may be the same or different from the semiconductor material of semiconductor substrate 10. The concentration of n-type dopant within the semiconductor material that provides the top nFET source region 46 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top nFET source region 46 may be grown on exposed sidewalls and a topmost surface of each semiconductor fin 12 in the nFET device region 100. The top nFET source region 46 may have a faceted surface. In one example, the top nFET source region 46 may be diamond shaped.

The top pFET source region 48 includes a semiconductor material (as defined above) and a p-type dopant (as also defined above). The semiconductor material that provides the top pFET source region 48 may be the same or different from the semiconductor material of semiconductor substrate 10. Also, the semiconductor material that provides the top pFET source region 48 may be the same as, or different from, the semiconductor material that provides the top nFET source region 46. The concentration of p-type dopant within the semiconductor material that provides the top pFET source region 48 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top pFET source region 48 may be grown on exposed sidewalls and a topmost surface of each semiconductor fin 12 in the pFET device region 102. The top pFET source region 48 may have a faceted surface. In one example, the top pFET source region 48 may be diamond shaped.

FIG. 12 illustrated a structure that includes a vertical transport nFET and a laterally adjacent vertical transport pFET. The vertical transport nFET includes at least one semiconductor fin 12 present in an nFET device region 100 and extending upwards from a semiconductor substrate 10, wherein an interfacial dielectric material layer 24 is located on a sidewall surface of a middle portion of the at least one semiconductor fin 12. A bottom nFET drain region 18 is located above the semiconductor substrate 10 and contacts a sidewall surface of a bottom portion of the at least one semiconductor fin 12. An nFET gradient threshold voltage adjusting gate dielectric structure (34, 26) is located above the bottom nFET drain region 18 and contacts the interfacial dielectric material 24, wherein the nFET gradient threshold voltage adjusting gate dielectric structure comprises an nFET doped interface high-k gate dielectric material 34 and a non-doped high-k dielectric material 26. A first workfunction gate electrode 38P is located adjacent a sidewall of the nFET gradient threshold voltage adjusting gate dielectric structure (34, 26) and a top nFET source region 46 is located on an upper portion of the at least one semiconductor fin 12.

The vertical transport pFET includes at least one semiconductor fin 12 present in a pFET device region 102 and extending upwards from the semiconductor substrate 10, wherein an interfacial dielectric material layer 26 is located on a sidewall surface of a middle portion of the at least one semiconductor fin 12. A bottom pFET drain region 20 is located above the semiconductor substrate 10 and contacts a sidewall surface of a bottom portion of the at least one semiconductor fin 12 present in the pFET device region 102. A pFET gradient threshold voltage adjusting gate dielectric structure (36, 26) is located above the bottom pFET drain region 22 and contacts the interfacial dielectric material layer 26, wherein the pFET gradient threshold voltage adjusting gate dielectric structure comprises a pFET doped interface high-k gate dielectric material 36 and a non-doped high-k dielectric material 26. A second workfunction gate electrode 38P is located adjacent a sidewall of the pFET gradient threshold voltage adjusting gate dielectric structure (36, 26), and a top pFET source region 48 is located on an upper portion of the at least one semiconductor fin 12.

As is illustrated in FIG. 12, the non-doped high-k dielectric material 26 of the gradient threshold voltage adjusting gate dielectric structure is positioned in close proximity to the top source region (46, 48), while the doped interface high-k gate dielectric (34, 36) is positioned in close proximity to the bottom drain region. The non-doped high-k dielectric material 26 has a higher threshold voltage than the doped interface high-k gate dielectric (34, 36). Thus, the gradient threshold voltage adjusting gate dielectric structure provides an asymmetric threshold voltage profile to the channel region of the FET. Notably, a steep potential distribution can be provided near the source regions, which enhances the vertical channel electric field and thus increases the carrier mobility.

In some embodiments, the percentage of high threshold voltage (near the source side) in the total channel length is from 20% to 50%. In some embodiments, the source side has a 100 mV to 300 mV higher threshold voltage than the drain side.

Figure 13:
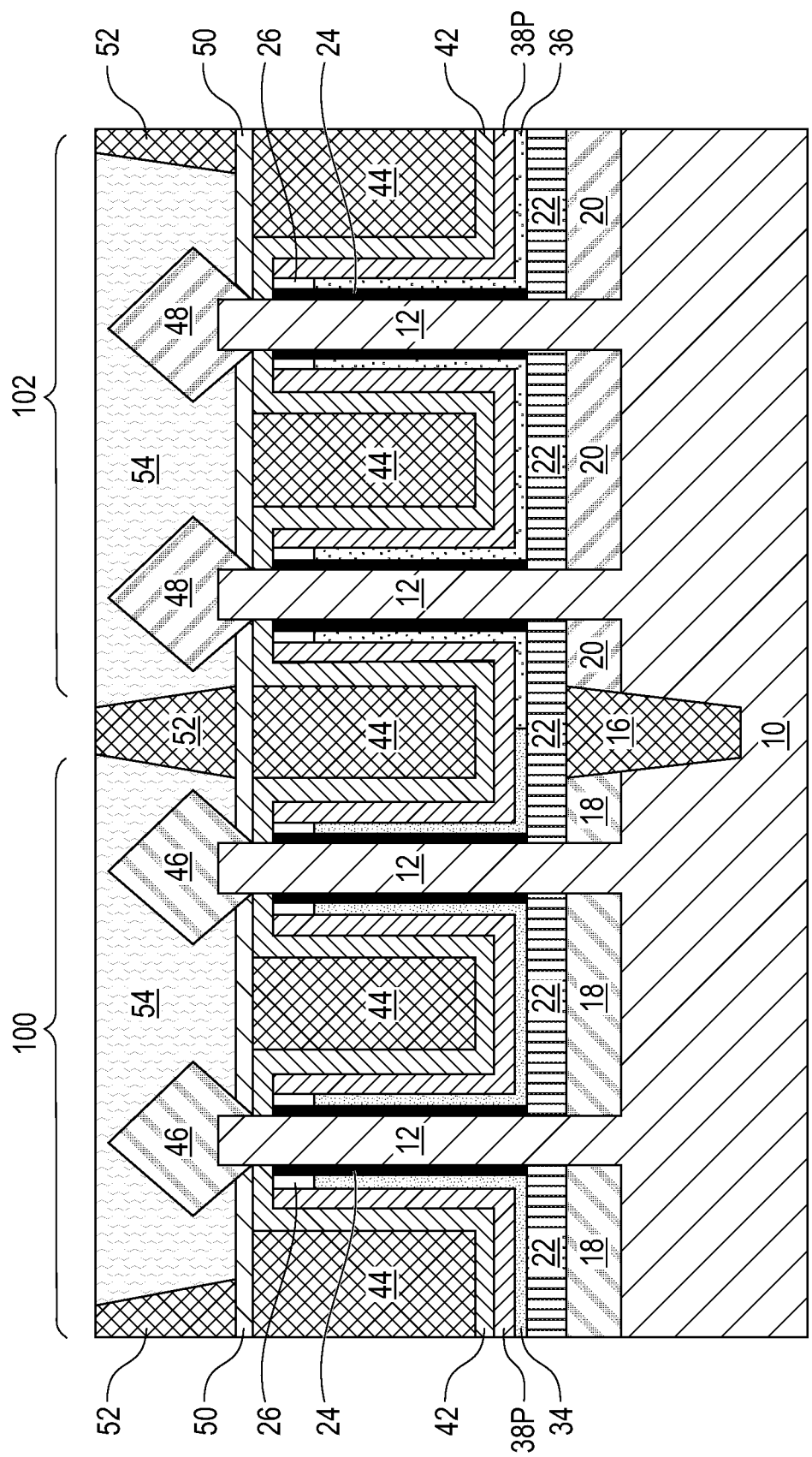
FIG. 13 is a cross sectional view of the exemplary semiconductor structure of FIG. 12 after forming a top spacer layer and contact structures.

Referring now to FIG. 13, there is illustrated the exemplary semiconductor structure of FIG. 12 after forming a top spacer layer 50 and contact structures 54. The top spacer layer 50 is formed on the physically exposed topmost surface of the MOL dielectric material structure 44 and on the physically exposed topmost surface of the gate encapsulation liner 42L.

The top spacer layer 50 may be composed of any dielectric spacer material including for example, silicon dioxide, silicon nitride or silicon oxynitride. The top spacer layer 50 may be composed of a same, or different, dielectric spacer material than the bottom spacer layer 22. The top spacer layer 50 may be formed utilizing a deposition process such as, for example, chemical vapor deposition or plasma enhanced chemical vapor deposition. In some instances, an etch may follow the deposition of the dielectric spacer material that provides the top spacer layer 50. The top spacer layer 50 may have a thickness from 4 nm to 10 nm. Other thicknesses that are lesser than, or greater than, the aforementioned thickness range may also be employed in the present application as the thickness of the top spacer layer 50.

After top spacer layer 50 formation, an interlayer dielectric (ILD) material 52 is formed. The ILD material 52 may include one of the dielectric materials mentioned above for the MOL dielectric material layer 44L. The ILD material 52 may include a same, or different dielectric material, than the MOL dielectric material layer 44L. The ILD material 52 may be formed by one of the deposition processes mentioned above in forming the MOL dielectric material layer 44L. A planarization process may follow the deposition of the dielectric material that provides the ILD material 50.

Contact openings (not specifically shown) are then formed into the ILD material 50 to physically exposed surfaces of the top nFET source region 44 and the top pFET source region 46. A contact metal such as, for example, copper, aluminum, tungsten, cobalt, or alloys thereof is the formed into each contact opening utilizing a deposition process. A planarization process may follow the deposition process. The contact metal or metal alloy within each contact opening is referred to herein as a contact structure 54. As shown in FIG. 13, the contact structures 54 have a topmost surface that is coplanar with a topmost surface of the ILD material 50.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one semiconductor fin present in a device region and extending upwards from a semiconductor substrate, wherein an interfacial dielectric material is located on a sidewall surface of a middle portion of the at least one semiconductor fin;
   a bottom drain region located above the semiconductor substrate and contacting a sidewall surface of a bottom portion of the at least one semiconductor fin;
   a gradient threshold voltage adjusting gate dielectric structure located above the bottom drain region and contacting the interfacial dielectric material, wherein the gradient threshold voltage adjusting gate dielectric structure comprises a doped interface high-k gate dielectric material and a non-doped high-k dielectric material;
   a workfunction gate electrode located adjacent a sidewall of the gradient threshold voltage adjusting gate dielectric structure;
   a top source region located on an upper portion of the at least one semiconductor fin; and
   a gate encapsulation liner located on the workfunction gate electrode and a topmost surface of the non-doped high-k dielectric material.

2. The semiconductor structure of claim 1, wherein the non-doped high-k dielectric material is positioned in proximity to the top source region, and the doped interface high-k gate dielectric material is positioned in proximity to the bottom drain region.

3. The semiconductor structure of claim 1, wherein the device region is an nFET device region, and the doped interface high-k gate dielectric is an nFET doped interface high-k gate dielectric that includes a dipole element selected from Group IIA or IIIB of the Periodic Table of Elements.

4. The semiconductor structure of claim 1, wherein the device region is a pFET device region, and the doped interface high-k gate dielectric is a pFET doped interface high-k gate dielectric that includes aluminum.

5. The semiconductor structure of claim 1, further comprising a MOL dielectric structure located adjacent the gate encapsulation liner.

6. The semiconductor structure of claim 5, further comprising a bottom spacer layer located between the bottom drain region and the gradient threshold voltage adjusting gate dielectric structure.

7. The semiconductor structure of claim 6, further comprising a top spacer layer located on the MOL dielectric structure.

8. The semiconductor structure of claim 1, further comprising a contact structure contacting the top source region.

9. A semiconductor structure comprising:
   a vertical transport nFET and a laterally adjacent vertical transport pFET, wherein
   the vertical transport nFET comprises:
     at least one semiconductor fin present in an nFET device region and extending upwards from a semiconductor substrate, wherein an interfacial dielectric material is located on a sidewall surface of a middle portion of the at least one semiconductor fin;
     a bottom nFET drain region located above the semiconductor substrate and contacting a sidewall surface of a bottom portion of the at least one semiconductor fin;
     an nFET gradient threshold voltage adjusting gate dielectric structure located above the bottom nFET drain region and contacting the interfacial dielectric material, wherein the nFET gradient threshold voltage adjusting gate dielectric structure comprises an nFET doped interface high-k gate dielectric material and a non-doped high-k dielectric material;
     a first workfunction gate electrode located adjacent a sidewall of the nFET gradient threshold voltage adjusting gate dielectric structure; and
     a top nFET source region located on an upper portion of the at least one semiconductor fin;
   the vertical transport pFET comprises:
     at least one semiconductor fin present in a pFET device region and extending upwards from the semiconductor substrate, wherein an interfacial dielectric material is located on a sidewall surface of a middle portion of the at least one semiconductor fin in the pFET device region;
     a bottom pFET drain region located above the semiconductor substrate and contacting a sidewall surface of a bottom portion of the at least one semiconductor fin present in the pFET device region;
     a pFET gradient threshold voltage adjusting gate dielectric structure located above the bottom drain region and contacting the interfacial dielectric material, wherein the pFET gradient threshold voltage adjusting gate dielectric structure comprises a pFET doped interface high-k gate dielectric material and a non-doped high-k dielectric material;
     a second workfunction gate electrode located adjacent a sidewall of the pFET gradient threshold voltage adjusting gate dielectric structure;
     a top pFET source region located on an upper portion of the at least one semiconductor fin;
   a gate encapsulation liner located on the first and second workfunction gate electrodes;
   a MOL dielectric structure located adjacent the gate encapsulation liner;
   a bottom spacer layer located between the bottom nFET drain region and the nFET gradient threshold voltage adjusting gate dielectric structure in the nFET device region and between the bottom pFET drain region and the pFET gradient threshold voltage adjusting gate dielectric structure in the pFET device region; and a top spacer layer located on the MOL dielectric structure.

10. The semiconductor structure of claim 9, wherein the non-doped high-k dielectric material in the nFET device region is positioned in proximity to the top nFET source region, the nFET doped interface high-k gate dielectric material is positioned in proximity to the bottom nFET drain region, and further wherein the non-doped high-k dielectric material in the pFET device region is positioned in proximity to the top pFET source region, and the pFET doped interface high-k gate dielectric material is positioned in proximity to the bottom pFET drain region.

11. The semiconductor structure of claim 9, further comprising a first contact structure contacting the top nFET source region, and a second contact structure contacting the top pFET source region.

* * * * *